United States Patent
Xu et al.

(10) Patent No.: US 10,274,772 B2
(45) Date of Patent: Apr. 30, 2019

(54) DISPLAY DEVICE

(71) Applicant: BOE TECHNOLOGY GROUP CO., LTD., Beijing (CN)

(72) Inventors: Jian Xu, Beijing (CN); Yong Qiao, Beijing (CN); Jianbo Xian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/574,830

(22) PCT Filed: May 9, 2017

(86) PCT No.: PCT/CN2017/083567
§ 371 (c)(1),
(2) Date: Nov. 16, 2017

(87) PCT Pub. No.: WO2017/198090
PCT Pub. Date: Nov. 23, 2017

(65) Prior Publication Data
US 2018/0246367 A1    Aug. 30, 2018

(30) Foreign Application Priority Data

May 17, 2016  (CN) .................... 2016 2 0448957 U

(51) Int. Cl.
*G02F 1/13*       (2006.01)
*G02F 1/1333*    (2006.01)
*G02F 1/1345*    (2006.01)

(52) U.S. Cl.
CPC ...... *G02F 1/133385* (2013.01); *G02F 1/1333* (2013.01); *G02F 1/1345* (2013.01);
(Continued)

(58) Field of Classification Search
CPC ................................................. H05K 7/20963
(Continued)

(56) References Cited

U.S. PATENT DOCUMENTS 6,703,702 B2 *  3/2004  Inoue .................... H01L 23/057
                                                                257/584
2002/0048152 A1   4/2002  Kurihara et al.
(Continued)

FOREIGN PATENT DOCUMENTS

CN        1665383 A       9/2005
CN     201097039 Y        8/2008
(Continued)

OTHER PUBLICATIONS

International Search Report & Box V of Written Opinion, for PCT Patent Application No. PCT/CN2017/083567, dated Jul. 27, 2017, 7 pages.

*Primary Examiner* — Mukundbhai G Patel
(74) *Attorney, Agent, or Firm* — Kinney & Lange, P.A.

(57) ABSTRACT

A display device is disclosed. The display device includes: a back plate; a display panel located at a displaying side of the back plate; a driver circuit board located at a non-displaying side of the back plate; an outer frame; a flexible circuit located at least partially between the back plate and the outer frame to connect the driver circuit board with the display panel; and a heat conductive structure located between the flexible circuit and the outer frame and contacting both of the flexible circuit and the outer frame.

9 Claims, 4 Drawing Sheets

(52) U.S. Cl.
CPC ............... *G02F 1/133308* (2013.01); *G02F 2001/13332* (2013.01); *G02F 2001/133311* (2013.01); *G02F 2001/133314* (2013.01)

(58) Field of Classification Search
USPC ................................................ 361/704, 752
See application file for complete search history.

(56) References Cited

U.S. PATENT DOCUMENTS

| | | | |
|---|---|---|---|
| 2005/0117304 A1 | 6/2005 | Kim | |
| 2006/0245167 A1* | 11/2006 | Jeong | H05K 5/02 361/718 |
| 2009/0270135 A1* | 10/2009 | Shoji | H04M 1/021 455/566 |
| 2013/0208509 A1* | 8/2013 | Cheng | G02F 1/133382 362/613 |
| 2014/0116661 A1* | 5/2014 | Xu | H01L 23/373 165/133 |

FOREIGN PATENT DOCUMENTS

| | | |
|---|---|---|
| CN | 102661554 A | 9/2012 |
| CN | 202581233 U | 12/2012 |
| CN | 103096627 A | 5/2013 |
| CN | 103925531 A | 7/2014 |
| CN | 204269982 U | 4/2015 |
| CN | 205620644 U | 10/2016 |

* cited by examiner

DISPLAY DEVICE

CROSS REFERENCE TO RELATED APPLICATIONS

This application is a Section 371 National Stage Application of International Application No. PCT/CN2017/083567, filed on 9 May 2017, entitled "DISPLAY DEVICE", which claims priority to Chinese Application No. 201620448957.7, filed on 17 May 2016, incorporated herein by reference in its entirety.

TECHNICAL FIELD

The present disclosure relates to the field of display technology, and particularly, to a display device.

BACKGROUND

In an existing display device, a liquid crystal panel is located at a displaying side of a back plate, a driver circuit board for driving the liquid crystal panel is generally located at a backside of the back plate facing away from the displaying side or at a lateral side of the back plate, the liquid crystal panel and the driver circuit board are connected by a flexible circuit, which extends across a sealant frame located at the periphery of the back plate to connect the liquid crystal panel with the driver circuit board. In the above described display device, when the liquid crystal panel is working, a large amount of heat generated by the flexible circuit cannot be dissipated quickly, so that the flexible circuit may fail easily or even be self-burnt due to a high temperature.

SUMMARY

Accordingly, it is an object of the present disclosure to provide a display device, for solving at least part of the above problems.

According to an aspect of the present disclosure, there is provided a display device.

According to an exemplary embodiment, the display device comprises: a back plate; a display panel located at a displaying side of the back plate; a driver circuit board located at a non-displaying side of the back plate; an outer frame; a flexible circuit located at least partially between the back plate and the outer frame to connect the driver circuit board with the display panel; and a heat conductive structure located between the flexible circuit and the outer frame and contacting both of the flexible circuit and the outer frame.

According to another embodiment, the heat conductive structure may comprise a heat dissipating layer contacting the outer frame and a heat conductive layer contacting the flexible circuit.

According to another embodiment, the heat dissipating layer may comprise a silicone pad, and the heat conductive layer comprises a heat conductive paper adhered to the silicone pad.

According to another embodiment, the heat conductive structure may comprise a flexible material.

According to another embodiment, the outer frame may comprise a front portion covering an edge of a light-emitting surface of the display panel and a lateral portion disposed around the display panel and the back plate; and the heat conductive structure contacts the lateral portion of the outer frame.

According to another embodiment, the display device may further comprise: a sealant frame located between the back plate and the outer frame and surrounding the back plate, the sealant frame being provided with a limiting slot; and the flexible circuit extends across the sealant frame and is retained within the limiting slot.

According to another embodiment, the flexible circuit may have a driver circuit chip, and the flexible circuit may comprise: a first portion located at the displaying side of the back plate and connected with the display panel; a second portion located at the side of the back plate opposite to the displaying side and connected with the driver circuit board; and a third portion located between the sealant frame and the lateral portion of the outer frame and connecting the first portion with the second portion, the third portion being located within the limiting slot of the sealant frame.

According to another embodiment, the heat conductive structure may be configured to extend across the limiting slot of the sealant frame.

According to another embodiment, the heat conductive structure is adhered to the lateral portion of the outer frame.

According to another embodiment, the lateral portion may only comprise a side plate located at a side of the back plate where the flexible circuit is provided.

According to another embodiment, the display device may further comprise a rear cover fitted with the side plate to enclose the back plate and the display panel.

According to another embodiment, the lateral portion is a frame surrounding the lateral sides of the back plate and the display panel.

According to another embodiment, the lateral portion of the outer frame is provided with a protruding part, and the heat conductive layer is adhered to the protruding part.

According to another embodiment, the protruding part and the outer frame are configured as an integrated structure.

BRIEF DESCRIPTION OF THE DRAWINGS

The above and other features of the present disclosure will become more apparent by describing in detail exemplary embodiments thereof with reference to the accompanying drawings, in which.

DETAILED DESCRIPTION OF EMBODIMENTS

Figure 1:
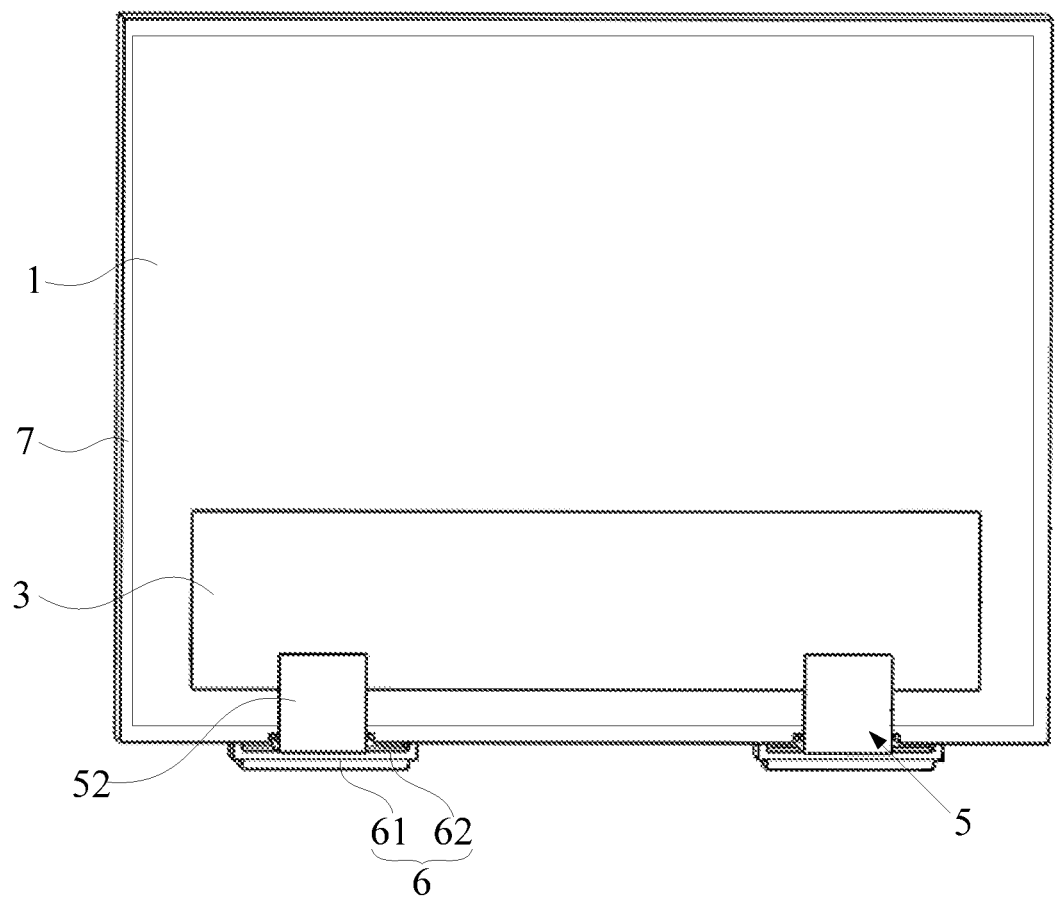
FIG. 1 schematically shows a display device according to an embodiment of the present disclosure.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiments set forth herein; rather, these embodiments are provided so that the present disclosure will be thorough and complete, and will fully convey the concept of the disclosure to those skilled in the art.

Please refer to FIGS. 1 to 5.

As shown in FIGS. 1-5, an embodiment of the present disclosure provides a display device, which includes: a back plate 1; a display panel 2 located at one side of the back plate 1; a driver circuit board 3 located at another side of the back plate 1 facing away from the display panel 2; an outer frame 4 surrounding peripheries of the back plate 1 and the display panel 2; a flexible circuit 5 located at least partially between the back plate 1 and the outer frame 4 to connect the driver circuit board 3 with the display panel 2; and a heat conductive structure 6 located between the flexible circuit 5 and the outer frame 4 and contacting both of the flexible circuit 5 and the outer frame 4.

Figure 4:
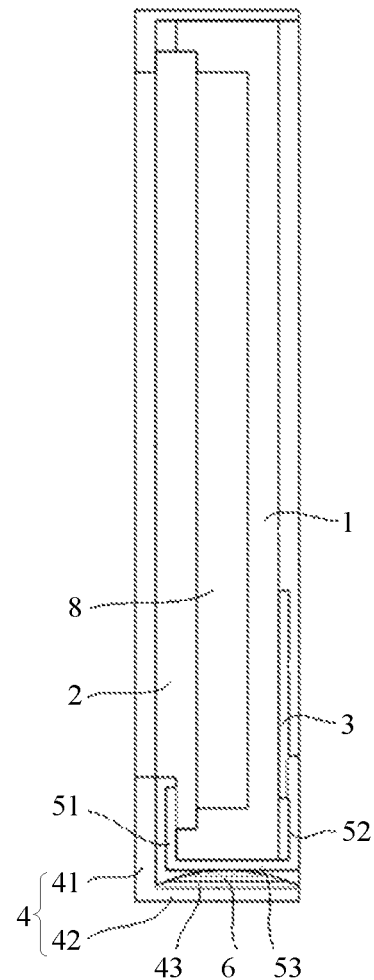
FIG. 4 is a cross-sectional view of a display device according to another embodiment of the present disclosure.
Figure 5:
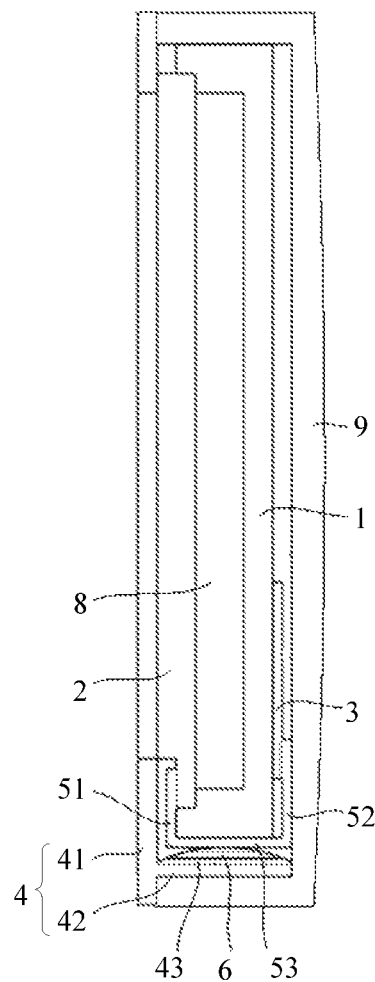
FIG. 5 is a cross-sectional view of a display device according to a further embodiment of the present disclosure.

It is to be noted that, in this specification, the "displaying side" of the back plate means the side of the back plate 1 where the display panel 2 is mounted (for example, the left side in each of FIGS. 4 and 5), and a "non-displaying side" of the back plate means other sides of the back plate 1 except the side where the display panel 2 is mounted, and the "non-displaying side" includes a top side, a bottom side, a left side and a right side of the back plate (as shown in FIG. 1), and includes the back side of the back plate opposite to the displaying side (such as the right side in each of FIGS. 4 and 5).

According to the above embodiment, by arranging the heat conductive structure 6 between the flexible circuit 5 and the outer frame 4 and contacting the heat conductive structure 6 with the flexible circuit 5 and outer frame 4, heat generated by the flexible circuit 5 can be conducted to the outer frame 4 through the heat conductive structure 6, such that the heat from the flexible circuit 5 can be quickly dissipated. Therefore, heat dissipation performance of the flexible circuit 5 in the display device is much better.

In an exemplary embodiment, as shown in FIGS. 1-5, the heat conductive structure 6 may be formed of a flexible material or may include a flexible material. Flexible materials generally have certain flexibility and elasticity, therefore, the heat conductive structure 6 may prevent abrasion defect from being generated on the flexible circuit 5 due to a direct and rigid contact between the flexible circuit 5 and the outer frame 4.

Figure 2:
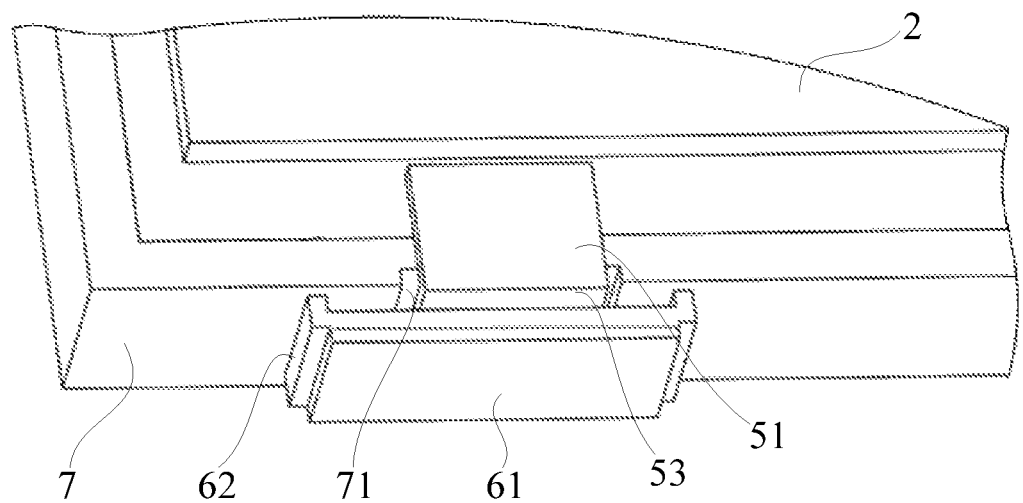
FIG. 2 is an illustrative drawing of a part of the display device shown in FIG. 1, showing a heat conductive structure.
Figure 3:
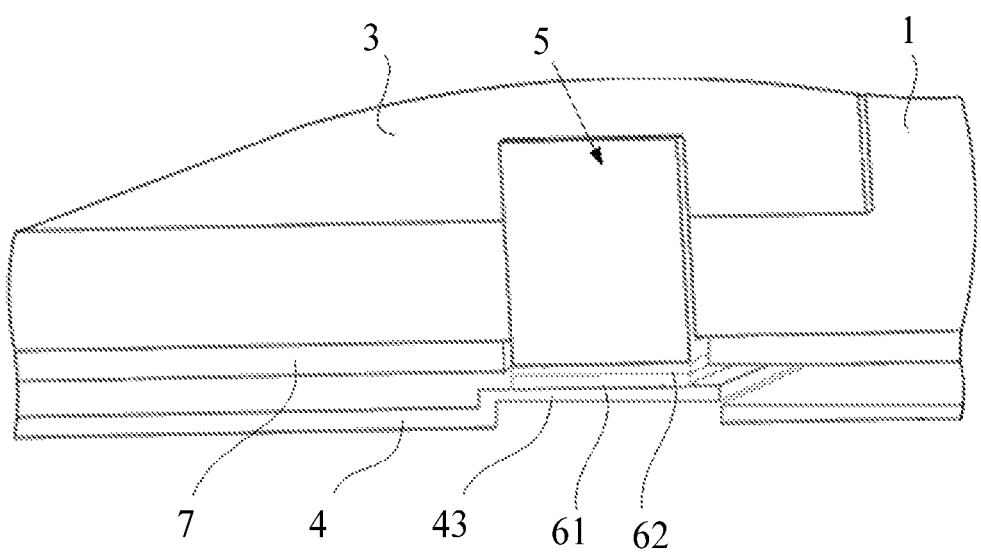
FIG. 3 schematically shows a heat conductive structure according to another embodiment of the present disclosure.

In a further exemplary embodiment, as shown in FIGS. 1-3, the display device of the disclosure may further include a sealant frame 7 located between the back plate 1 and the outer frame 4 and surrounding the periphery of the back plate 1. The sealant frame 7 may be provided with a limiting slot 71, such that the flexible circuit 5 may extend across the sealant frame 7 through the limiting slot 71 to connect the display panel with the circuit board and may be retained within the limiting slot 71.

By disposing the flexible circuit 5 within the limiting slot 71 of the sealant frame 7, relative position between the flexible circuit 5 and the sealant frame 7 may be relatively fixed, such that the flexible circuit 5 may be prevent from moving, and the contact between the flexible circuit 5 and the heat conductive structure 6 may be maintained, and any abrasion caused due to movement of the flexible circuit 5 can be avoided.

Further, as shown in FIG. 4, the display device of this disclosure may also include a backlight source 8 located between the back plate 1 and the display panel 2 and configured for providing backlight for the display panel 2.

According to an exemplary embodiment, as shown in FIGS. 4 and 5, the outer frame 4 may include a front portion 41 configured to limit and locate the edge of a light emitting surface of the display panel 2, and a lateral portion 42 disposed along lateral peripheries of the display panel 2 and the back plate 1. The heat conductive structure 6 contacts the lateral portions 42 of the outer frame 4. For example, as shown in FIG. 4, the lateral portion 42 may be a frame configured to surround the lateral sides of the back plate 1 and the lateral sides of the display panel 2, so as to limit positions of the lateral sides of the back plate 1 and the lateral sides of the display panel 2; or, as shown in FIG. 5, the lateral portion 42 may also only include a side plate disposed facing a side of the back plate where the flexible circuit 5 is provided, and in this circumstance, the display device may include a rear cover 9 fitted with the side plate to enclose the back plate 1 and the display panel 2.

In an exemplary embodiment, as shown in FIGS. 4 and 5, the flexible circuit 5 may have a driver circuit chip, and specifically, the flexible circuit 5 may include: a first portion 51 located at the displaying side of the back plate 1 and connected with the display panel 2; a second portion 52 located at the side of the back plate 1 opposite to the displaying side and connected with the driver circuit board 3; and a third portion 53 located between the sealant frame 7 and the lateral portion 42 of the outer frame 4 and connecting the first portion 51 with the second portion 52, where the third portion 53 is located within the limiting slot 71 of the sealant frame 7.

As shown in FIGS. 1 to 3, in an exemplary embodiment, the heat conductive structure 6 may include a heat dissipating layer contacting the outer frame 4 and a heat conductive layer contacting the flexible circuit 5. For example, the heat dissipating layer is a silicone pad 61, and the heat conductive layer is a heat conductive paper 62 attached to a side of the silicone pad 61 facing the flexible circuit 5. However, the heat conductive structure 6 is not limited to the above bi-material structure, and the heat conductive structure 6 of the present disclosure may also be made of other flexible heat conductive material(s).

Based on the above embodiment, according to a preferable example, as shown in FIGS. 1 and 2, the heat conductive structure 6 may be configured to extend across the limiting slot 71 of the sealant frame 7, and particularly, the heat conductive paper 62 of the heat conductive structure 6 contacts the third portion 53 of the flexible circuit 5, and the silicone pad 61 contacts the lateral portion 42 of the outer frame 4; or, as shown in FIGS. 3-5, the silicone pad 61 of the heat conductive structure 6 may be adhered to the lateral portion 42 of the outer frame 4, and the heat conductive paper 62 contacts the third portion 53 of the flexible circuit 5.

As shown in FIG. 3, in an exemplary embodiment, the lateral portion 42 of the outer frame 4 may be provided with a protruding part 43 at a side of the lateral portion 42 facing the flexible circuit 5, and the heat conductive structure 6 may be adhered to the protruding part 43.

By providing the protruding part 43 on the lateral portion of the outer frame 4, the heat conductive structure 6 may be ensured to abut against both the flexible circuit 5 and the protruding part 43, such that the heat conductive structure 6 can be ensured to contact both the flexible circuit 5 and the outer frame 4.

Preferably, the protruding part 43 and the outer frame 4 may be formed as an integrated structure.

It would be apparent to an ordinary skilled in the art that, if the driver circuit board is disposed at a lateral side of the back plate (for example, at the bottom side of the back plate, as shown in FIG. 1), then the flexible circuit may only include the first portion located at the displaying side of the back plate and configured for being connected with the display panel, and the second portion located at the lateral side (e.g., the bottom side) of the back plate and configured for being connected with the driver circuit board. In this circumstance, the heat conductive structure may be adhered between and contact with the front portion of the outer frame and the first portion of the flexible circuit.

It is to be noted that, in the display device of the present disclosure, the number of the flexible circuit 5 for connecting the driver circuit board 3 with the display panel 2 may be one, two or more, and accordingly, the heat conductive structure 6 may be disposed between each flexible circuit 5 and the outer frame 4.

Additionally, in case of the outer frame 4 being formed of a metal material, heat could be transmitted to the outer frame 4 even if the heat conductive structure 6 has a relative small size, and the flexible circuit 5 may be provided with a relative larger heat dissipating area and a relative better heat dissipating effect. Therefore, in this case, the size of the heat conductive structure 6 could be made smaller. While the outer frame 4 is made of a non-metal material, the size of the heat conductive structure 6 should be properly enlarged to facilitate heat dissipation.

Apparently, technical solutions of the present disclosure can be applied to various display products, such as LCDs, OLEDs and the like. Various changes or modifications may be made in these embodiments by those skilled in the art without departing from the principles and spirit of the disclosure, and those changes and modifications shall fall within the scope of the present disclosure. The scope of the present disclosure is defined in the claims and their equivalents.

What is claimed is:

1. A display device, comprising:
   a back plate;
   a display panel located at a displaying side of the back plate;
   a driver circuit board located at a non-displaying side of the back plate;
   an outer frame;
   a flexible circuit located at least partially between the back plate and the outer frame to connect the driver circuit board with the display panel;
   a heat conductive structure located between the flexible circuit and the outer frame and contacting both of the flexible circuit and the outer frame; and
   a sealant frame located between the back plate and the outer frame and surrounding the back plate, wherein the sealant frame is provided with a limiting slot facing away from the back plate,
   wherein the flexible circuit extends across the sealant frame and is retained within the limiting slot;
   wherein the heat conductive structure comprises a heat dissipating layer contacting the outer frame and a heat conductive layer contacting the flexible circuit;
   wherein the outer frame comprises a front portion covering an edge of a light-emitting surface of the display panel and a lateral portion disposed around the display panel and the back plate, and the heat conductive structure contacts the lateral portion of the outer frame;
   wherein the heat conductive structure is adhered to the lateral portion of the outer frame; and
   wherein the lateral portion of the outer frame is provided with a protruding part and the heat conductive layer is adhered to the protruding part.

2. The display device according to claim 1, wherein the heat dissipating layer comprises a silicone pad and the heat conductive layer comprises a heat conductive paper adhered to the silicone pad.

3. The display device according to claim 1, wherein the heat conductive structure comprises a flexible material.

4. The display device according to claim 1, wherein the flexible circuit has a driver circuit chip and the flexible circuit comprises:
   a first portion located at the displaying side of the back plate and connected with the display panel;
   a second portion located at the side of the back plate opposite to the displaying side and connected with the driver circuit board; and
   a third portion located between the sealant frame and the lateral portion of the outer frame and connecting the first portion with the second portion, the third portion being located within the limiting slot of the sealant frame.

5. The display device according to claim 4, wherein the heat conductive structure is configured to extend across the limiting slot of the sealant frame.

6. The display device according to claim 1, wherein the lateral portion only comprises a side plate located at a side of the back plate where the flexible circuit is provided.

7. The display device according to claim 6, wherein the display device further comprises a rear cover fitted with the side plate to enclose the back plate and the display panel.

8. The display device according to claim 1, wherein the lateral portion is a frame surrounding the lateral sides of the back plate and the display panel.

9. The display device according to claim 8, wherein the protruding part and the outer frame are configured as an integrated structure.

\* \* \* \* \*